(12) United States Patent
Kodera et al.

(10) Patent No.: US 6,544,590 B1
(45) Date of Patent: Apr. 8, 2003

(54) LIQUID COATING METHOD, APPARATUS AND FILM-FORMING METHOD FOR PRODUCING THE SAME EMPLOYING EXCESS COATING REMOVING UNIT HAVING ABSORBENT FABRIC ON POROUS STRUCTURE

(75) Inventors: Yasuto Kodera, Kanagawa (JP); Fumikazu Kobayashi, Kanagawa (JP); Toshinori Furusawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 101 days.

(21) Appl. No.: 09/695,076

(22) Filed: Oct. 25, 2000

(30) Foreign Application Priority Data

Jan. 17, 2000 (JP) ........................................ 2000-007321

(51) Int. Cl.$^7$ ............................................... B05D 3/12
(52) U.S. Cl. ........................ 427/350; 427/294; 427/355; 427/356; 427/358; 427/359; 427/384; 118/50; 118/58; 118/70; 118/428; 118/500
(58) Field of Search ................................. 427/356, 294, 427/358, 384, 350, 355, 359; 118/410, 50, 58, 70, 428, 500

(56) References Cited

U.S. PATENT DOCUMENTS 5,640,655 A 6/1997 Shoji ........................... 399/249
6,139,639 A * 10/2000 Kitamura et al. ........... 118/680

FOREIGN PATENT DOCUMENTS

| JP | 9-15981 | | 1/1997 |
| JP | 10-12710 | * | 1/1998 |
| JP | 11-90295 | | 4/1999 |
| JP | 11-239754 | | 9/1999 |

* cited by examiner

Primary Examiner—Katherine A. Bareford
(74) Attorney, Agent, or Firm—Fitzpatrick, Cella, Harper & Scinto

(57) ABSTRACT

In a coating method for forming a film of a coating material on a substrate by supplying the coating material from a coating unit to the substrate held by a stage while the coating unit is moved relative to the stage, the stage includes a substrate-holding section and a peripheral section which has a surface higher than that of the substrate-holding section. The coating method includes the steps of mounting the substrate on the substrate-holding section of the stage; forming the film of the coating material so that the coating covers the substrate and extends to the peripheral section; and removing the coating material remaining in the peripheral section by a coating material removing unit after the substrate provided with the film is dismounted from the stage.

16 Claims, 8 Drawing Sheets

LIQUID COATING METHOD, APPARATUS AND FILM-FORMING METHOD FOR PRODUCING THE SAME EMPLOYING EXCESS COATING REMOVING UNIT HAVING ABSORBENT FABRIC ON POROUS STRUCTURE

BACKGROUND OF THE INVENTION

1. Field of the Invention

The present invention relates to a coating method for forming a liquid film in fabrication processes for electronic devices, such as liquid crystal display devices and semiconductor devices; a coating apparatus; and a method of forming a film.

2. Description of the Related Art

Fabrication processes for liquid crystal display devices, semiconductor devices, and the like, include steps for forming various types of films. Examples of these films are photosensitive films, such as a photoresist film used in photolithography, alignment films and colored films of color filters used for liquid crystal display devices, and interlayer insulating films used for semiconductor devices.

Conventionally, such films have been made of films of coating solutions (liquid films) which are formed by spin coating. Recently, as one method for forming a liquid film, a die coating method is receiving attention. In the die coating method, a coating head (die head) provided with a slit having an opening of approximately 10 to 100 $\mu$m comprising parallel edges of two die blades is used. A coating solution, which is ejected from the slit by a gas compressor, a pump, or the like, is directly applied to a planar substrate, such as a glass substrate or a semiconductor wafer, to form a liquid film. The die coating method is also referred to as a slit coating method or an extrusion coating method.

Methods and apparatuses for die coating (slit coating) are disclosed in Japanese Patent Laid-Open Nos. 10-012710 and 11-090295, for example.

By using the die coating method, the amount of a coating solution used can be significantly reduced in comparison with the conventionally used spin coating method. Also, in the case of a liquid crystal display device using a rectangular substrate, a liquid film can be formed only where required on the substrate.

While the die coating method is suitable for rectangular substrates, such as glass substrates used for liquid crystal display devices and the like, with respect to circular and nonrectangular substrates, such as silicon wafers and recording disks, because of the structure of the coating head for ejecting the coating solution, it is difficult to apply the coating solution only onto the substrates. As will be described below, if application is performed by modifying the shape of a stage for holding a substrate, the coating solution is also applied to the periphery of the stage. When a solvent in the coating solution is vaporized, a solidified material remains on the stage, which may affect a film of the coating solution subsequently ejected from the coating head, resulting in nonuniform thickness, and for example, the formation of stripes.

Additionally, in the conventional coating method, regardless of rectangular substrates or nonrectangular substrates, the liquid film formed has insufficient in-plane uniformity. In particular, nonuniform thickness readily occurs where the thickness of the liquid film on edges of a substrate differs from the thickness of the liquid film in the center of the substrate.

SUMMARY OF THE INVENTION

It is an object of the present invention to provide a coating method and to provide a coating apparatus for applying a liquid film, in which the liquid film can be uniformly applied repeatedly.

It is another object of the present invention to provide a coating method, a coating apparatus, and a film-forming method, in which a liquid film or a film having superior in-plane uniformity can be formed on a substrate.

In one aspect of the present invention, in a coating method for forming a film of a coating material on a substrate by supplying the coating material from a coating unit to the substrate held by a stage while the coating unit is moved relative to the stage, the stage including a substrate-holding section and a peripheral section which has a surface higher than that of the substrate-holding section, the coating method includes the steps of mounting the substrate on the substrate-holding section of the stage; forming the film of the coating material so that the coating range extends to the peripheral section; and removing the coating material remaining in the peripheral section by a coating material removing unit after the substrate provided with the film is dismounted from the stage.

In another aspect of the present invention, a coating apparatus includes a stage for holding a substrate, a coating unit for supplying a coating material onto the substrate, and a coating material removing unit. A film of the coating material is formed by supplying the coating material onto the substrate held by the stage while the coating unit and the stage are moved relative to each other. The stage includes a substrate-holding section and a peripheral section which has a surface higher than that of the substrate-holding section, and the coating material removing unit removes the coating material applied to the peripheral section of the stage.

In another aspect of the present invention, a method of forming a film includes a step of applying a film of a coating material to a substrate by the coating method of the present invention and a step of baking the film formed by the coating material.

In another aspect of the present invention, in a coating method as well as in a coating apparatus, while a coating head including a slit comprising at least two parallel blades is moved relative to a stage for holding a substrate, a coating material is ejected from the coating head to form a film of the coating material on the substrate held by the stage. After the substrate is dismounted from the stage, the coating material adhering to the stage is removed by a coating material removing unit, and then coating is performed on a new substrate.

In accordance with the present invention, by removing the coating material adhering to the stage, nonuniform thickness, which may occur in a liquid film subsequently formed, can be avoided.

By applying a liquid film to the substrate so that the peripheral section of the stage, which has a surface having a height close to that of the surface of the substrate to be coated, is also within the coating range, nonuniform thickness on the edge of the substrate can be avoided.

Further objects, features and advantages of the present invention will be apparent from the following description of the preferred embodiments with reference to the attached drawings.

DESCRIPTION OF THE PREFERRED EMBODIMENTS

Embodiments of the present invention will be described with reference to the drawings.

Although the coating method, such as the die coating method, is suitable for rectangular substrates, with respect to circular and nonrectangular substrates, such as silicon wafers and recording disks, because of the structure of the coating head for ejecting a coating solution, it is difficult to apply the coating solution only onto the substrates.

Additionally, whether the substrates are rectangular or nonrectangular, the liquid film formed on the substrate has insufficient in-plane uniformity, and in particular, nonuniform thickness readily occurs where the thickness of the liquid film on the edge of the substrate differs from the thickness of the liquid film in the center of the substrate.

In order to overcome the problems described above, the height of the periphery of the stage is increased so that the upper surface of the peripheral section of the stage is substantially level with the surface of the substrate to be coated, and the coating solution is applied so as to extend to the peripheral section of the stage. As a result, it is possible to improve uniformity in the thickness of the liquid film formed on the substrate.

However, if the coating solution remains on the peripheral section of the stage, it solidifies, thus preventing uniform coating in the subsequent coating process.

Therefore, in the present invention, a removing unit is provided, which can remove foreign matter, such as the coating solution and the film of the coating solution remaining on the peripheral section of the stage, and, if generated, a solidified material thereof, so that the peripheral section of the stage is cleaned and a liquid film can be formed with a uniform thickness.

Figure 1:
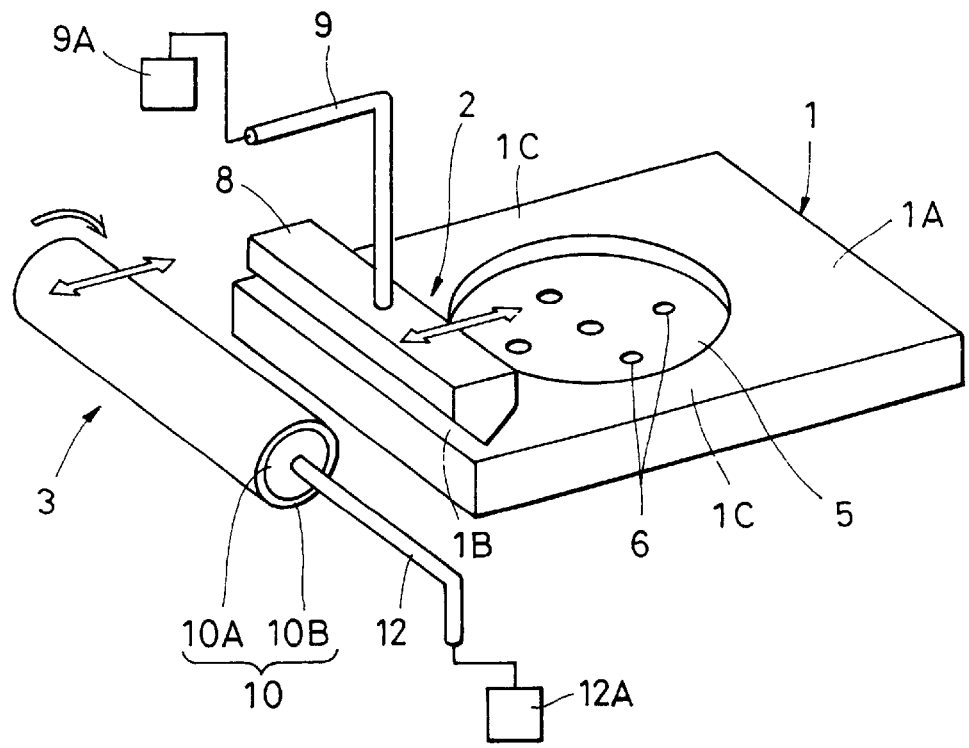
FIG. 1 is a perspective view which schematically shows a coating apparatus in an embodiment of the present invention.
Figure 2:
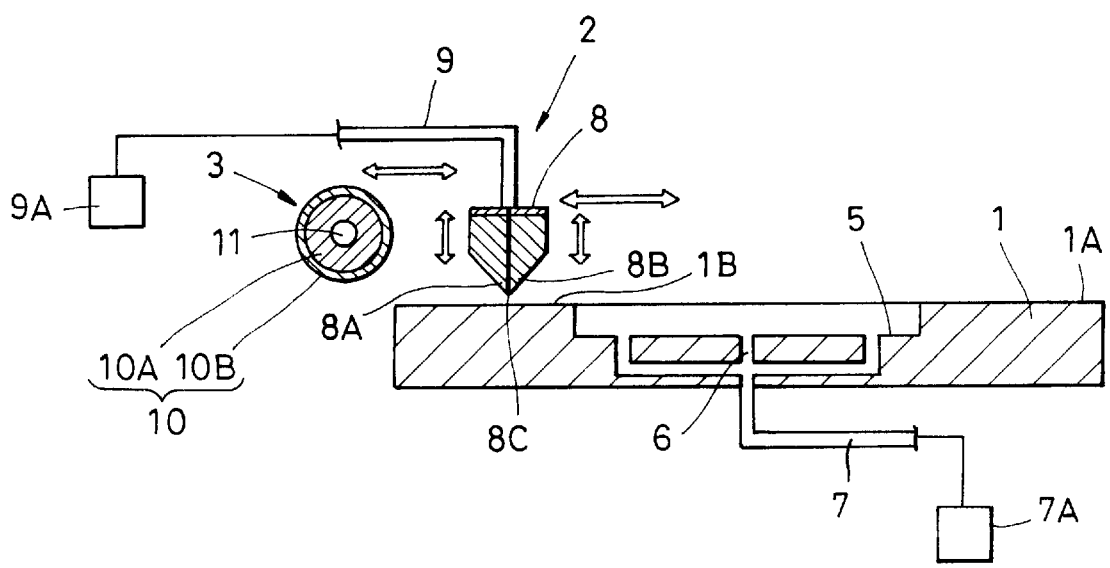
FIG. 2 is a sectional view of the coating apparatus shown in FIG. 1.

FIG. 1 is a perspective view which schematically shows a coating apparatus in a first embodiment of the present invention, and FIG. 2 is a sectional view of the coating apparatus shown in FIG. 1.

FIGS. 3A to 3D are schematic diagrams illustrating the steps of forming a film of a coating solution by a die coating method and of removing the coating solution in accordance with the present invention.

FIGS. 4A to 4D are perspective views illustrating the steps of forming the film of the coating solution by the die coating method and of removing the coating solution shown in FIGS. 3A to 3D.

As shown in FIGS. 1 and 2, the coating apparatus in this embodiment includes a stage 1 for holding a substantially circular substrate W, such as a wafer, a coating unit 2 for applying a coating solution to the substrate W held by the stage 1, and a coating solution removing unit 3 for removing the coating solution remaining on and adhering to the stage 1.

The stage 1 is provided with a substrate-holding section 5 comprising a recess for holding the substrate W, which has a size substantially corresponding to the size of the substrate W so that the surface of the substrate W to be coated is substantially level with the surfaces 1A, 1B, and 1C of the peripheral section of the stage 1.

For example, when a wafer having a thickness of 0.625 mm and a diameter of 125 mm (a so-called "5-inch wafer") is coated, the recess of the substrate-holding section 5 is formed so as to have a size corresponding to the size of the wafer (with a diameter of 125 mm and a depth of 0.625 mm).

As required, suction holes 6 which are connected to the substrate-holding section 5 are provided on the stage 1 so that the substrate W is held in the substrate-holding section 5 in close contact with the bottom of the recess, and the suction holes 6 are connected to a vacuum suction source 7A via a suction tube 7.

The coating unit 2 includes a coating head (die head) 8, a coating solution supply source 9A for supplying a coating solution to the coating head 8, a coating solution feed channel 9 for connecting the coating head 8 to the coating solution supply source 9A. The coating solution supply source 9A includes a pump, a coating solution vessel, a compressor, a diaphragm, a valve, etc.

The coating head 8 is provided with a slit 8C having an opening of 10 to 100 μm composed of at least two blades 8A and 8B, and the length of the slit 8C is slightly larger than the maximum width (herein corresponding to the diameter of the wafer) of the substrate W to be coated. The coating head 8 is vertically adjustable so as to be located with a slight distance above the surface 1A of the peripheral section of the stage 1 and also is constructed so as to be translated relative to the stage 1.

Consequently, by ejecting the coating solution from the slit 8C while the coating head 8 is translated along the surface of the substrate W to be coated relative to the stage 1, the entire upper surface of the substrate W held by suction on the stage 1 is coated with the coating solution, and thus a liquid film can be formed on the substrate W.

The coating solution removing unit 3 for removing the coating solution adhering to the stage 1 includes a liquid absorbing roller 10 composed of a cylindrical porous structure 10A which can be moved while rotating on the surface of the stage 1, a hollow shaft 11 provided with many holes on the surface disposed in the center of the liquid absorbing roller 10, and a vacuum suction source 12A which is connected to the hollow shaft 11 via a vacuum suction channel 12. A highly absorbent fabric 10B composed of ultrafine fibers with a fine high-density structure may be further wound around the surface of the porous structure 10A of the liquid absorbing roller 10 in order to accelerate the absorption of the coating solution. As the highly absorbent fabric 10B, a polyurethane resin or the like may be used. As the porous structure 10A, ceramics or the like may be used.

With respect to the coating solution removing unit 3, by rotating and moving the liquid absorbing roller 10 on the surface of the stage 1, the coating solution adhering to the stage 1 can be absorbed by the highly absorbent fabric 10B and the porous structure 10A. Furthermore, by applying a negative pressure, which is lower than the atmospheric pressure, to the hollow shaft 11 using the vacuum suction source 12A, the coating solution adhering to the surface of the stage 1 is vacuumed up and absorbed via the surface of the liquid absorbing roller 10 composed of the highly absorbent fabric 10B and the porous structure 10A, and is then vacuumed up from the periphery of the liquid absorbing roller 10 to the center, and the vacuumed-up solution is conveyed from the hollow shaft through the vacuum suction channel 12 to be discharged out of the liquid absorbing roller 10. As the coating solution removing unit, a liquid absorber such as the one disclosed in Japanese Patent Laid-Open No. 9-015981 may be used.

Next, a method for forming a liquid film by applying a coating solution to a substrate held by suction on a stage and for removing the coating solution adhering to the stage, using the coating apparatus described above, will be described stepwise with reference to FIGS. 3A to 3D and FIGS. 4A to 4D.

Figure 3A:
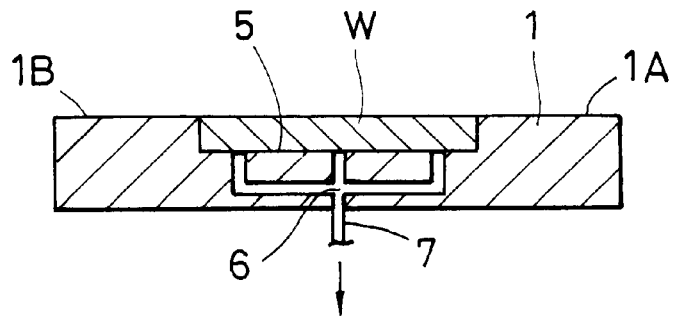
FIGS. 3A to 3D are schematic diagrams illustrating steps of forming a film of a coating material by a die coating method and of removing the coating material in accordance with the present invention.
Figure 4A:
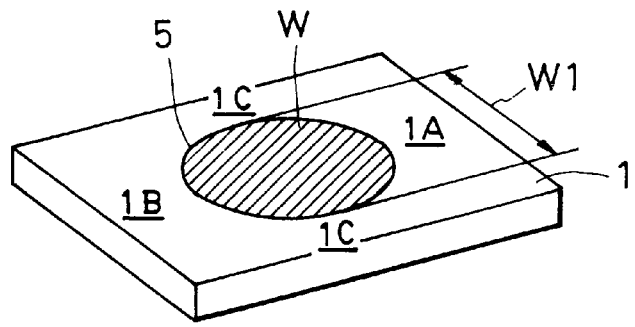
FIGS. 4A to 4D are perspective views illustrating the steps of forming the film of the coating material by the die coating method and of removing the coating material shown in FIGS. 3A to 3D.

First, as shown in FIGS. 3A and 4A, a substrate W, such as a semiconductor wafer or a recording disk, is disposed on the bottom of the substrate-holding section 5 of the stage 1. The substrate W is made to adhere to the substrate-holding section 6 by suction by activating the vacuum suction source 7A so that the suction holes 6 have a pressure that is lower than the atmospheric pressure, and thus the substrate W is held by the stage 1. The surface of the substrate W to be coated is level with the surfaces 1A and 1B of the peripheral section of the stage 1. Herein, "being level with" is not limited to that the height of the surface of the substrate to be coated and the height of the surface 1A of the peripheral section of the stage are completely equal to each other without any error. An error of approximately −20 μm, when the surface of the substrate to be coated is lower, and an error of +200 μm, when the surface of the substrate to be coated is higher, may be allowed.

Figure 3B:
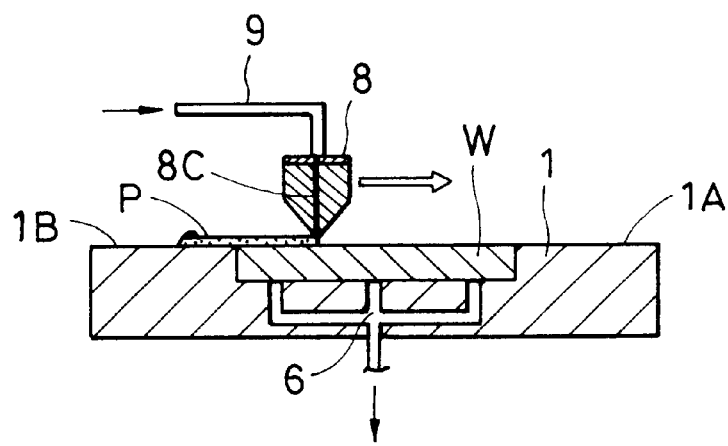
Figure 4B:
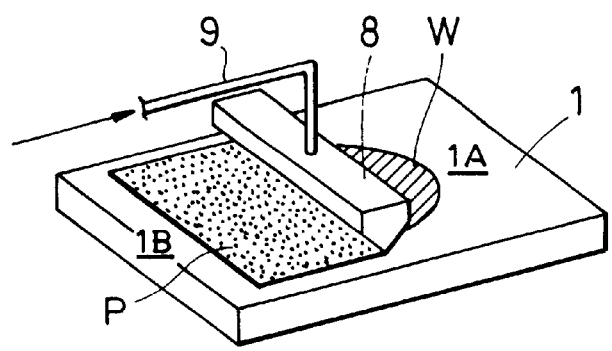

Next, as shown in FIGS. 3B and 4B, the coating unit 2 is operated. By ejecting a coating solution P from the slit 8C of the coating head 8 while the coating head 8 is moved along the surface of the substrate W to be coated held by the stage 1 in a direction perpendicular to the longitudinal direction of the slit 8C, the coating solution P is applied to the region including the entire surface of the substrate W to be coated.

As shown in the drawing, the coating solution is preferably applied so as to extend to the peripheral section.

In particular, as shown in the drawing, preferably, a certain distance is provided between the point where coating starts on the surface 1B of the peripheral section of the stage and the edge of the substrate W and also a certain distance is provided between the edge of the substrate W and the point where the coating ends on the surface 1A of the peripheral section of the stage.

Preferably, as shown in the drawing, the length of the slit 8C is set longer than the maximum width W1 (herein, the diameter of the circular substrate) of the substrate W so that the coating solution is also applied on the surface 1C of the peripheral section of the stage on either side of the substrate W in the moving direction of the head.

More preferably, the coating solution P is applied to the surfaces 1A, 1B, and 1C of the peripheral section of the stage and the entire surface of the substrate W to be coated.

Figure 3C:
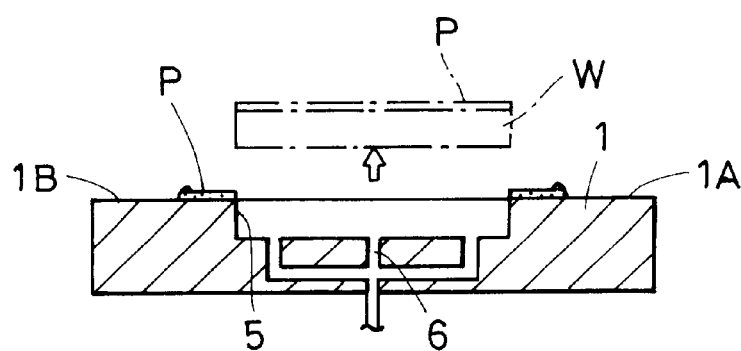

The pressure of the suction holes 6 is increased back to atmospheric pressure by releasing the suction of the substrate W by the vacuum suction source 7A. As shown in FIG. 3C, by dismounting the substrate W from the substrate-holding section 5 of the stage 1, the substrate W in which the entire upper surface is coated can be obtained.

Figure 4C:
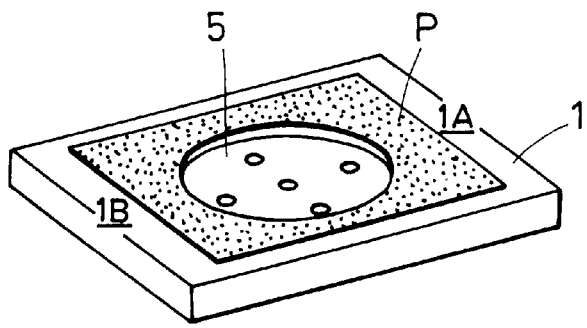

After the substrate W is removed, the coating solution P adheres to the stage 1 in the region (a portion of the peripheral section) shown in FIGS. 3C and 4C.

Figure 3D:
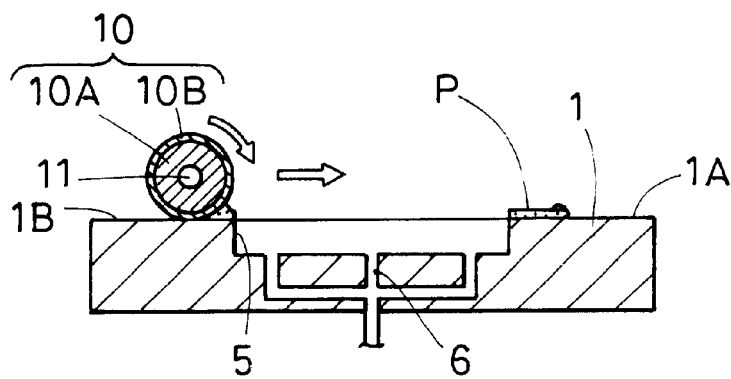
Figure 4D:
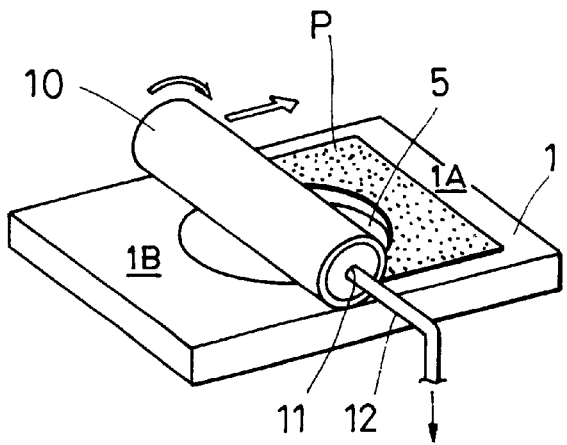

As shown in FIGS. 3D and 4D, the coating solution P adhering to the stage 1 is removed by rotating and moving the liquid absorbing roller 10 on the surfaces 1A, 1B, and 1C of the stage 1 under pressure. That is, when the hollow shaft 11 is applied with a negative pressure, which is lower than the atmospheric pressure, using the vacuum suction source 12A the liquid absorbing roller 10 is rotated and moved on the surface of the stage 1. The coating solution adhering to the surface of the stage 1 is vacuumed up and absorbed via the surface of the liquid absorbing roller 10 which is composed of the highly absorbent fabric 10B and the porous structure 10A. The coating solution is then vacuumed up from the periphery of the liquid absorbing roller 10 to the center, and the vacuumed-up solution is conveyed from the hollow shaft through the vacuum suction channel 12 to be discharged out of the liquid absorbing roller 10.

By treating and removing the coating solution P on the stage 1 as described above, the coating solution P does not enter the substrate-holding section 5 and most of the coating solution P on the stage 1 can be removed.

After the coating solution P is removed by the coating solution removing unit 3 as shown in FIGS. 3D and 4D, a new substrate W is held by suction in the substrate-holding section 5 of the stage 1 and the coating solution P is applied by the coating head 8 in the same manner as that described above.

By repeating the application of the coating solution P to the substrate W and the removal of the coating solution P adhering to the stage 1 as described above, nonuniform thickness of the liquid film due to the residual coating solution does not occur and the liquid film can be formed without any problem.

Moreover, by applying the coating solution so that the ends of the liquid film to be formed lie on the surfaces of the peripheral section of the stage, a uniform liquid film can be formed on the surface of the substrate W. The process thereof will be described in detail with reference to FIGS. 5A and 5B.

Figure 5A:
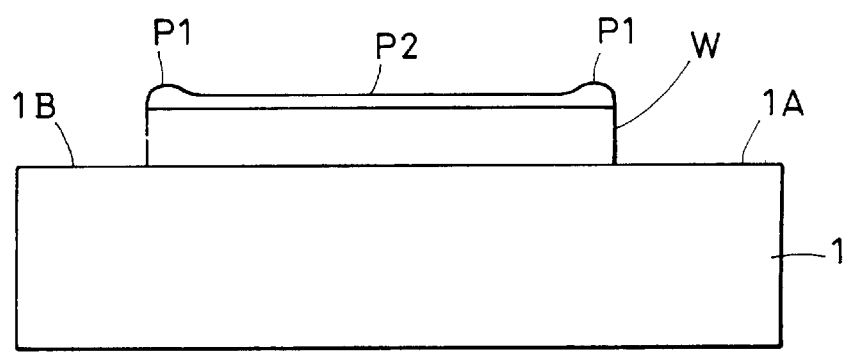
FIGS. 5A and 5B are sectional views of films of coating solutions obtained by coating methods in a comparative example and in an example of the present invention, respectively.

FIG. 5A is a schematic sectional view which shows a substrate W placed on a stage 1, the level of surfaces 1A and 1B of the peripheral section of the stage 1 differing from the level of the surface of the substrate W by the thickness of the substrate W. A liquid film is applied only to the surface of the substrate W to be coated, in a comparative example. In contrast, FIG. 5B is a schematic sectional view which shows a substrate W placed on a stage 1, surfaces 1A and 1B of the peripheral section of the stage 1 being substantially level with the surface of the substrate W, and a liquid film formed on the surface of the substrate W to be coated as well as on the surfaces 1A and 1B of the peripheral section, in an example of the present invention.

In either case, the thickness of the liquid film at the end P1 is larger than the thickness of the liquid film in the center P2. In FIG. 5A, the thicker portions P1 lie on the ends of the substrate W. However, in FIG. 5B, since the thicker portions P1 lie on the surfaces 1A and 1B of the peripheral section of the stage, the thickness of the liquid film on the end of the substrate W is the same as the thickness of the liquid film in the center. Accordingly, a uniform liquid film can be formed on the entire surface of the substrate W.

Figure 5B:
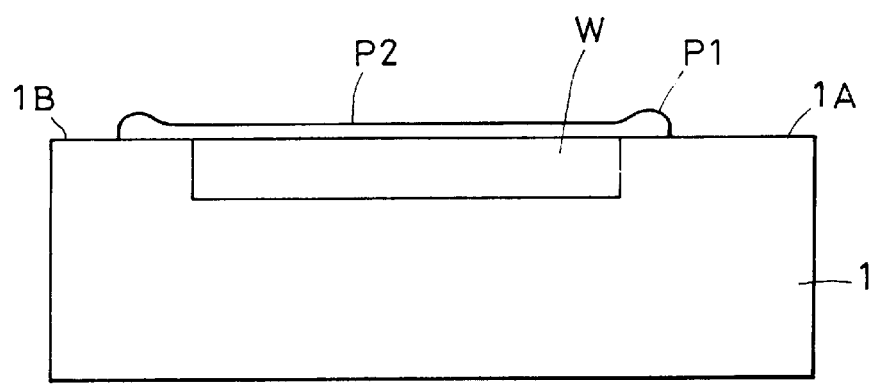

Preferably, the surface of the substrate W and the surface of the peripheral section of the stage are level with each other as shown in FIG. 5B so that the enclosure of bubbles by the liquid film or the separation of the liquid film at the boundary between the peripheral section and the substrate can be avoided. Although it depends on the viscosity of the coating solution and the thickness of the liquid film, if the height of the surface of the substrate W relative to the height of the peripheral section ranges from approximately 20 $\mu$m lower to 200 $\mu$m higher, the enclosure of bubbles or the separation of the liquid film can be avoided when the coating solution used in the field related to the present invention is applied.

By removing the coating solution P remaining on the stage 1 using the liquid absorbing roller 10 each time after the coating solution P is applied to the substrate W, a plurality of substrates, such as wafers, can be coated continuously, and liquid films having uniform in-plane thickness can be formed.

Figure 6:
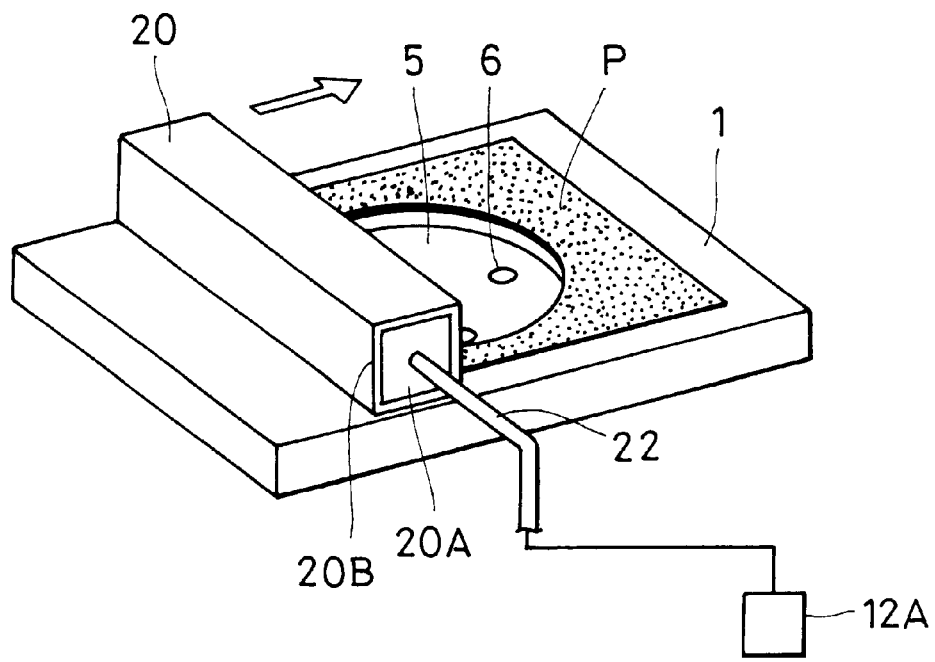
FIG. 6 is a perspective view of a coating apparatus for applying a liquid film in another embodiment of the present invention, which illustrates a method of removing a coating solution.

Next, a coating apparatus for applying a liquid film in a second embodiment of the present invention will be described with reference to FIGS. 6 and 7. FIG. 6 is a perspective view of a coating apparatus, showing a state in which a coating solution adhering to a stage is removed after a film of a coating solution is formed on a substrate, and FIG. 7 is a sectional view of the coating apparatus shown in FIG. 6.

This embodiment differs from the first embodiment in that a liquid absorbing block, which does not rotate when it is moving, is used as a coating solution removing unit for removing the coating solution on stage 1. The other structures and the methods of forming the film of the coating solution in this embodiment are the same as those in the previous embodiment. The same numerals are used for the same members as those in the previous embodiment.

Figure 7:
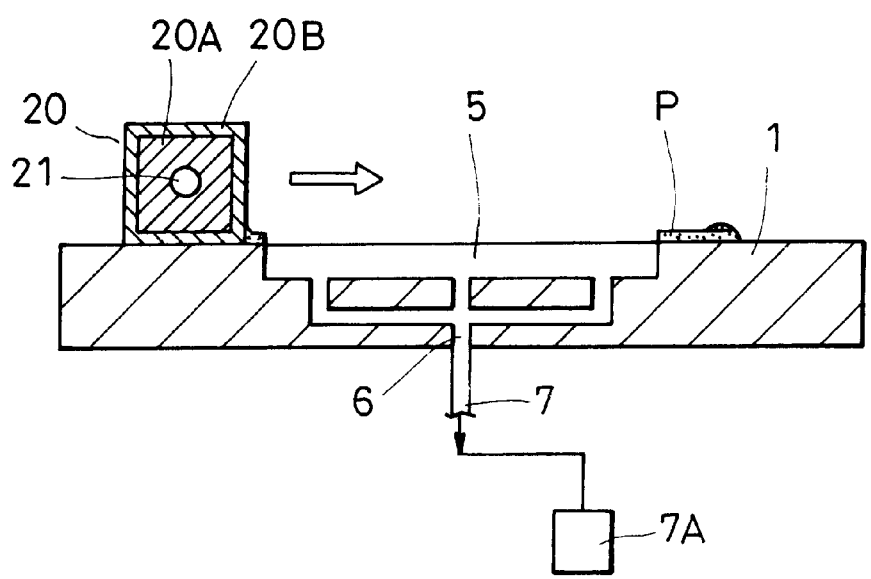
FIG. 7 is a sectional view of the coating apparatus shown in FIG. 6.

In FIGS. 6 and 7, a liquid absorbing block 20 is composed of a porous structure 20A of polygonal cross-section (square cross-section in the drawing), and a highly absorbent fabric 20B composed of ultrafine fibers with a fine high-density structure is wound around the surface of the porous structure 20A in order to accelerate the absorption of a coating solution P. A hollow shaft 21 provided with many holes on the surface is disposed in the center of the liquid absorbing block 20, and the hollow shaft 21 is connected to a vacuum suction source 12A via a vacuum suction channel 22.

The liquid absorbing block 20 having the structure described above is moved without rotating with one side of the block being pressed to the stage 1, and thus the coating solution P adhering to the stage 1 is removed. That is, by moving the liquid absorbing block 20 along the stage 1, the coating solution P adhering to the stage 1 is absorbed by the highly absorbent fabric 20B and the porous structure 20A. Also by applying a negative pressure to the hollow shaft 21 using the vacuum suction source 12A, the coating solution P adhering to the surface of the stage 1 is vacuumed up and absorbed via the surface of the liquid absorbing block 20, and is then vacuumed up from the periphery of the liquid absorbing block 20 to the center. The vacuumed-up solution is conveyed from the hollow shaft 21 through the vacuum suction channel 22 to be discharged out of the liquid absorbing block 20.

In this embodiment, the process of applying a coating solution to a substrate held by suction on the stage is performed in a manner similar to that in the previous embodiment. That is, a substrate W is mounted on a substrate-holding section 5 of the stage 1, and a negative pressure is applied to suction holes 6 so that the substrate W is held by suction. Next, by a coating unit 2 (not shown in FIGS. 6 and 7), the coating solution P is applied to a region including the entire surface of the substrate W. A vacuum suction source 7A is then stopped to return the pressure of the suction holes 6 back to atmospheric pressure to release the substrate W, and by dismounting the substrate W from the stage 1, the substrate W provided with the film of the coating solution on the entire surface is obtained (refer to FIGS. 3A to 3C and FIGS. 4A to 4C).

In order to remove the coating solution P adhering to the stage 1, as shown in FIGS. 6 and 7, a negative pressure is applied to the hollow shaft 21 of the liquid absorbing block 20 by the vacuum suction source 12A, and the liquid absorbing block 20 is translated on the stage 1 while being pressed on the surface of the peripheral section of the stage 1. Thus, the coating solution P adhering to the stage 1 is absorbed and vacuumed up from the surface of the liquid absorbing block 20 comprising the highly absorbent fabric 20B and the porous structure 20A. The coating liquid P is vacuumed up from the surface of the liquid absorbing block 20 to the center of the liquid absorbing block 20, and is then conveyed from the hollow shaft 21 through the vacuum suction channel 22 to be discharged out of the liquid absorbing block 20. In the above process, the liquid absorbing block 20 is moved along the surface of the stage without rotating.

With respect to the liquid absorbing block 20 in this embodiment, if the ability of the side in pressure contact with the stage 1 to absorb the liquid is decreased, by rotating the liquid absorbing block 20 so that a different side is brought into contact with the stage 1, the ability to absorb the liquid can be maintained. For example, preferably, whenever a liquid film is formed on a substrate, the block 20 is rotated by 90 degrees, 180 degrees, or 270 degrees, and the coating liquid on the stage is removed using a different side from that previously used.

In this embodiment, the coating solution P is also prevented from entering the substrate-holding section 5 of the stage 1 and substantially all the coating solution P remaining on and adhering to the stage 1 can be removed. By removing the coating solution P on the stage 1 every time the coating solution P is applied to the substrate W, a plurality of substrates, such as wafers, can be continuously coated with the coating solution.

As described above, since the thickness of the liquid film is nonuniform at both ends corresponding to the starting and ending points for the formation of the liquid film, the coating range is preferably arranged so that the liquid film is also formed in the peripheral section of the stage by the coating unit.

Figure 8:
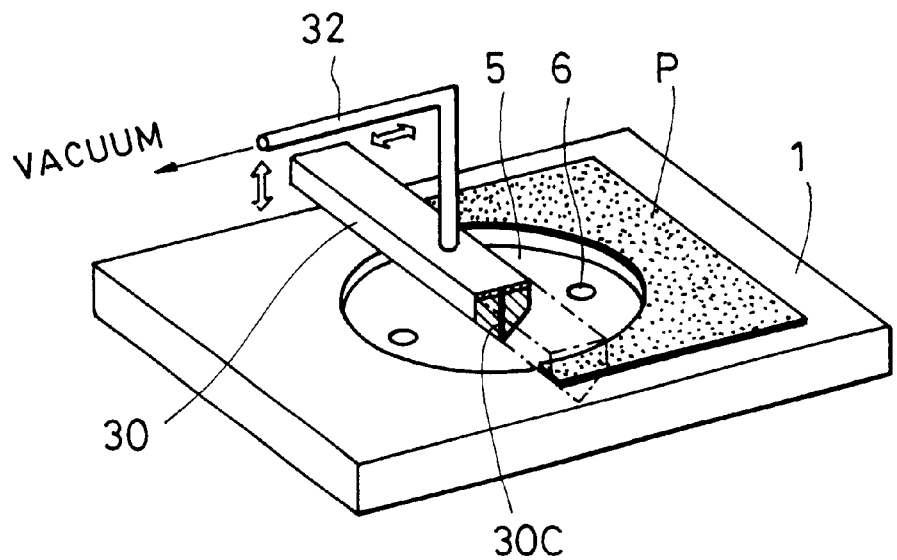
FIG. 8 is a perspective view of a coating apparatus in another embodiment of the present invention, which illustrates a method of removing a coating solution.

Next, a coating apparatus for applying a liquid film in a third embodiment of the present invention will be described with reference to FIGS. 8 and 9. FIG. 8 is a perspective view of a coating apparatus, showing a state in which a coating solution adhering to a stage is removed after a liquid film is formed on a substrate, and FIG. 9 is a sectional view of the coating apparatus shown in FIG. 8.

This embodiment differs from the previous embodiments in that a different coating solution removing unit is used. However, the other structures and the methods of forming a liquid film are the same as those in the previous embodiments, and the same numerals are used for the same members as those in the previous embodiments.

Figure 9:
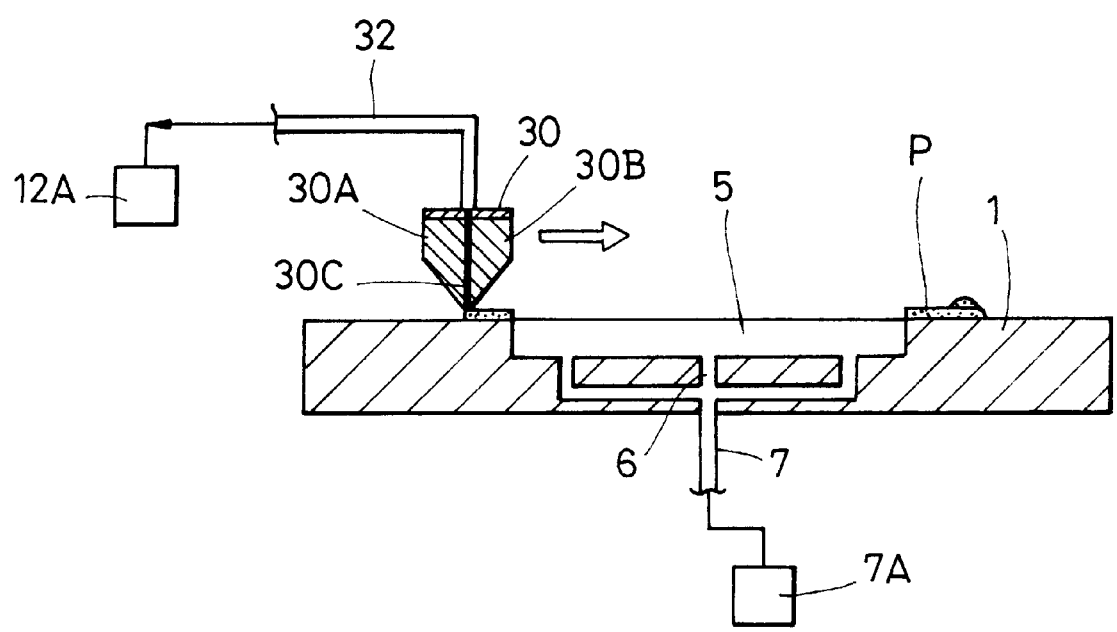
FIG. 9 is a sectional view of the coating apparatus shown in FIG. 8.

In FIGS. 8 and 9, a coating solution removing unit includes a suction head 30 having a length that is substantially the same as the width of a stage 1, and a vacuum suction source 12A which is connected to the suction head 30 via a vacuum suction tube 32. The suction head 30 includes a slit 30C composed of two blades 30A and 30B disposed in parallel. The slit 30C has an opening in the range of approximately 50 µm to 10 mm, and herein the opening of the slit 30C is set at 100 µm. In the coating solution removing unit described above, by bringing the slit 30C of the suction head 30 close to or into contact with the stage 1 and by translating the suction head 30 along the surface of the stage 1 while activating the vacuum suction source 12A, a coating solution P adhering to the stage 1 can be vacuumed up by the tip of the slit 30C and can be discharged through the vacuum suction tube 32.

In this embodiment the process of applying the coating solution P to a substrate W held by suction on the stage 1 to form a film of the coating solution is performed in the same manner as that in the previous embodiments. After the substrate W is held by suction on a substrate-holding section 5 of the stage 1, the coating solution P is applied to a region covering the entire surface of the substrate W by a coating unit 2 (not shown in FIGS. 8 and 9). A vacuum suction source 7A is then stopped to release the suction of the substrate W, and the substrate W is dismounted from the stage 1, and thus the substrate W provided with the film of the coating solution on its entire surface is obtained (refer to FIGS. 3A to 3C and FIGS. 4A to 4C).

As shown in FIGS. 8 and 9, by bringing the slit 30C of the suction head 30 close to or into contact with the stage 1 and by translating the suction head 30 along the surface of the stage 1 while activating the vacuum suction source 12A, the coating solution P adhering to the stage 1 is vacuumed up by the tip of the slit 30C and is discharged through the vacuum suction tube 32.

In an experiment, the coating solution adhering to the stage 1 was removed by setting the distance between the tip of the slit 30C of the suction head 20 and the stage 1 at 10 µm and the moving rate of the suction head 20 at 10 mm/sec. Substantially all the coating solution P on the stage 1 was removed without the coating solution P entering the substrate-holding section 5 of the stage 1. The coating solution on the stage 1 was removed by the suction head 30 every time a liquid film was formed on a substrate W, such as a wafer, and thus it was possible to form liquid films on a plurality of substrates continuously.

Figure 10:
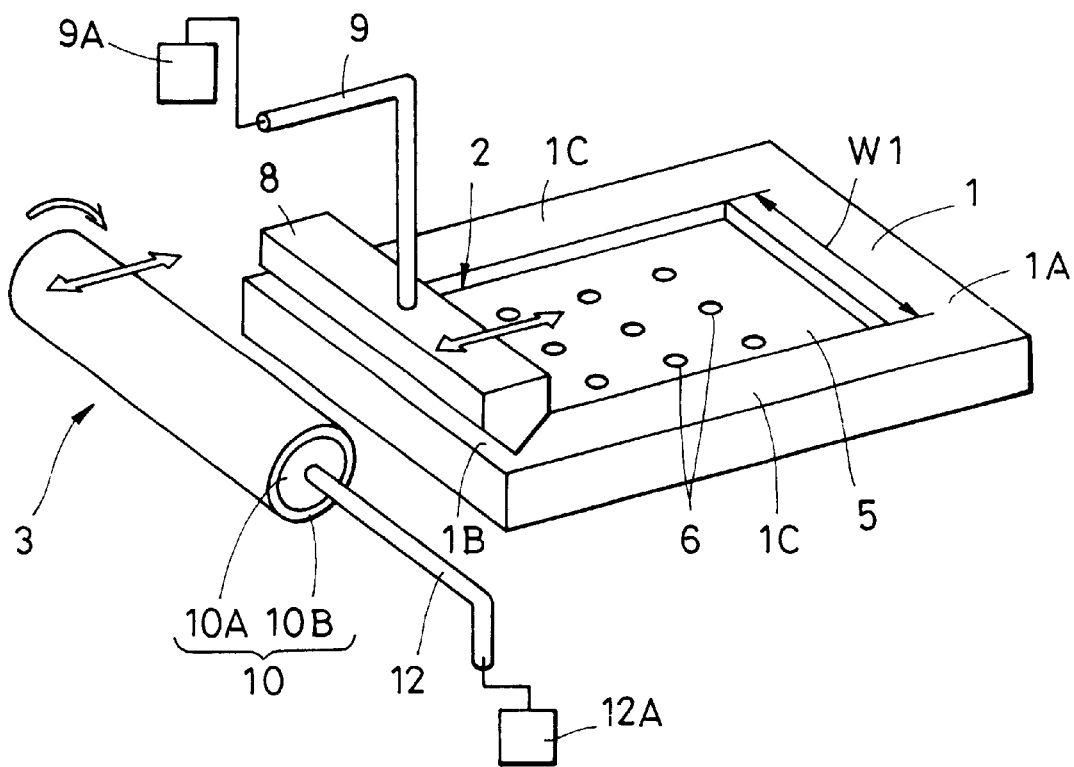
FIG. 10 is a perspective view which schematically shows a coating apparatus in another embodiment of the present invention.

Next, a coating apparatus for applying a liquid film in another embodiment will be described with reference to FIG. 10. FIG. 10 is a perspective view of a coating apparatus in a fourth embodiment of the present invention.

This embodiment differs from the previous embodiments in that, as shown in FIG. 10, a substrate-holding section 5 provided on a stage 1 is a rectangular recess so as to hold a rectangular substrate, such as a glass substrate. The depth of the recess is substantially equal to the thickness of the rectangular substrate so that the surface of the substrate to be coated is substantially level with the surfaces 1A, 1B, and 1C of the peripheral section of the stage 1.

The length of a slit 8C (not shown in FIG. 10) is equal to or slightly longer than the maximum width W1 of a substrate W to be coated (herein the width of the rectangular substrate in the longitudinal direction of the slit 8C).

The other structures and the coating methods are the same as those described in the previous embodiments.

Since the liquid film remains at least on the surfaces 1A and 1B of the peripheral section of the stage 1, a liquid absorbing roller 10 is rotated and moved on the stage 1 under pressure so as to remove a coating liquid P adhering to the stage 1. Of course, the coating solution removing unit described in the second or third embodiment may be used.

Figure 11:
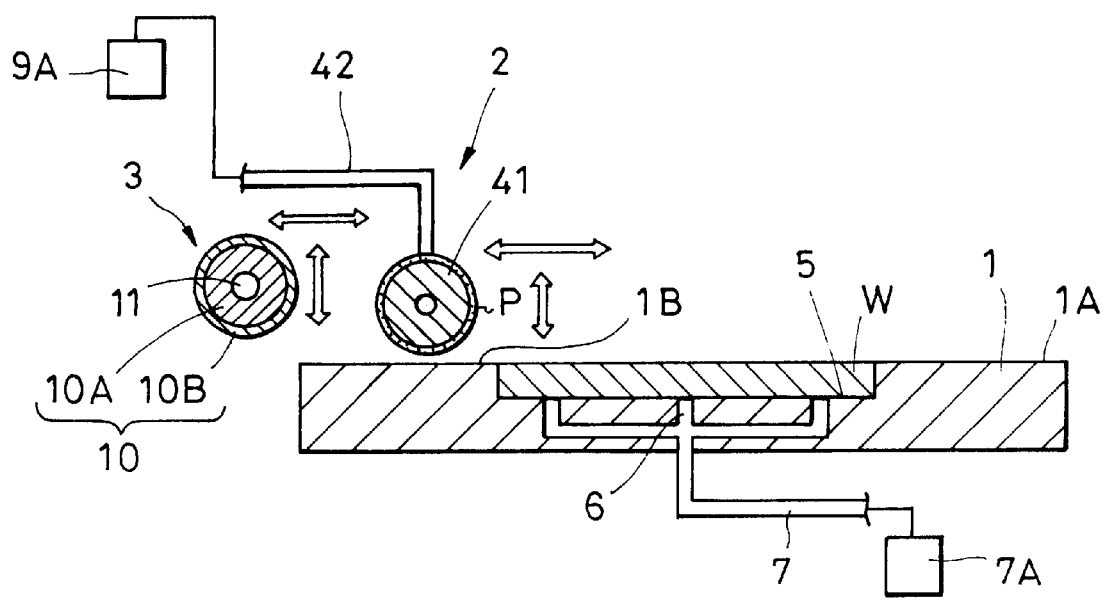
FIG. 11 is a sectional view which schematically shows a coating apparatus in another embodiment of the present invention.

Next, a coating apparatus for applying a liquid film in another embodiment will be described with reference to FIG. 11. FIG. 11 is a sectional view of a coating apparatus in a fifth embodiment of the present invention.

This embodiment differs from the previous embodiments in that, as shown in FIG. 11, as a coating unit, a roll coater provided with a coating roller 41 is used. A coating solution is fed to the surface of the coating roller 41 through a coating solution feed channel 42, and the coating roller 41 is rotated and moved on a substrate W so that the coating solution is applied to the substrate W. As the substrate W, a circular substrate, such as a wafer or disk, or a rectangular substrate, such as a glass substrate, may be used. The length of the coating roller is equal to or slightly larger than the maximum width of the substrate W. Accordingly, a liquid film is formed on the substrate W and extends to at least a portion of surfaces 1A and 1B of the peripheral section of a stage 1.

The other structures and the coating methods are the same as those described in the previous embodiments.

After the substrate is dismounted, since the liquid film remains at least on the surfaces 1A and 1B of the peripheral section of the stage 1, the coating solution P adhering to the stage 1 is removed by pressing and moving a liquid absorbing roller 10 on the surfaces 1A and 1B of the peripheral section while rotating the liquid absorbing roller 10. Of course, the coating solution removing unit described in the second or third embodiment may be used.

Figure 12:
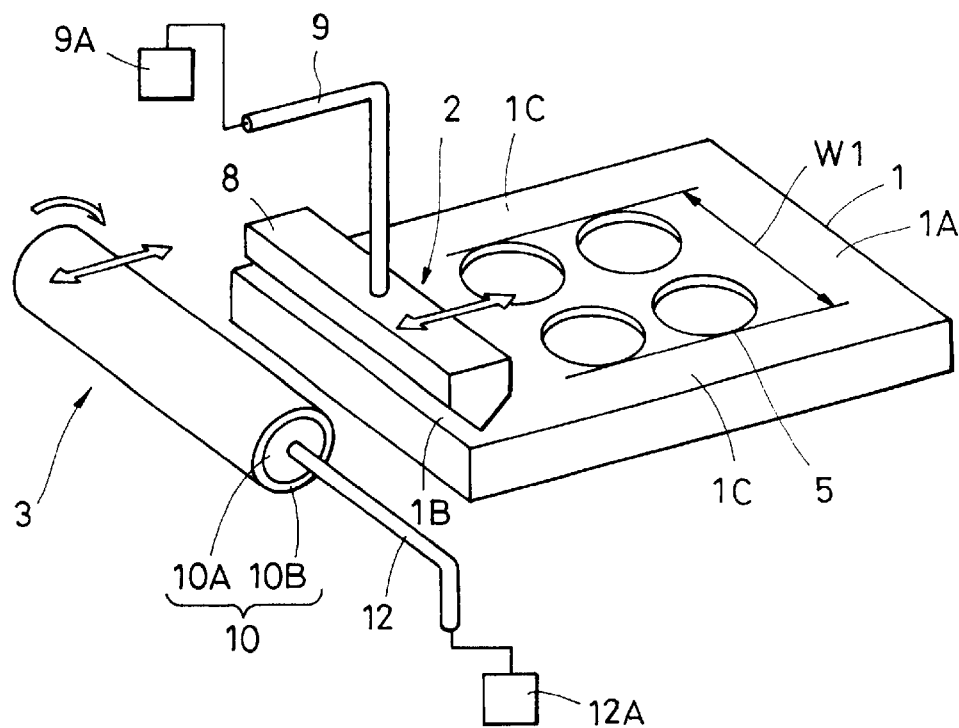
FIG. 12 is a perspective view which schematically shows a coating apparatus in another embodiment of the present invention.

Next, a coating apparatus for applying a liquid film in another embodiment will be described with reference to FIG. 12. FIG. 12 is a perspective view of a coating apparatus in a sixth embodiment of the present invention.

This embodiment differs from the previous embodiments in that, as shown in FIG. 12, a stage 1 is constructed so that a plurality of substrates W can be held. As the substrates W, rectangular substrates, such as glass substrates, may be used instead of the circular substrates, such as wafers and disks, as shown in the drawing. The length of a coating unit is equal to or slightly larger than the maximum width W1 of an array of the substrates (the length in the longitudinal direction of a slit). Thus, a liquid film is formed on the substrates W and also on at least a portion of the peripheral section of the stage 1.

The other structures and the coating methods are the same as those described in the previous embodiments.

After the substrates are dismounted, since the liquid film remains at least on the surface of the peripheral section of the stage 1, a coating solution P adhering to the stage 1 is removed by pressing and moving a liquid absorbing roller 10 on the surface the peripheral section of the stage 1 while rotating the liquid absorbing roller 10. Of course, as the coating solution removing unit, the one described in the second or third embodiment may be used, and as the coating unit, the coating roller used in the fifth embodiment may be used.

Figure 13:
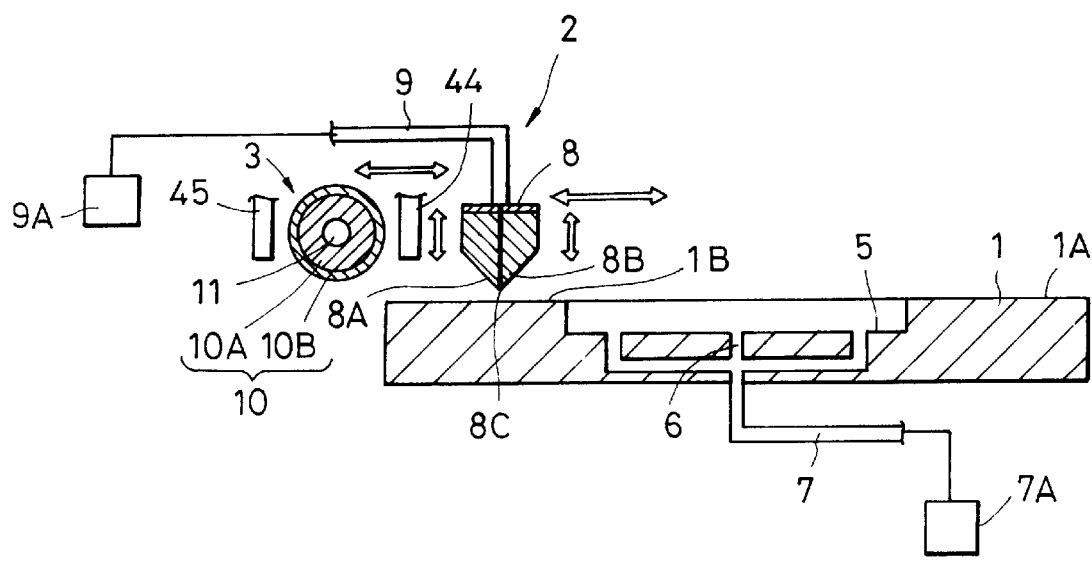
FIG. 13 is a sectional view which schematically shows a coating apparatus in another embodiment of the present invention.

A coating apparatus for applying a liquid film in another embodiment will be described with reference to FIG. 13. FIG. 13 is a sectional view of a coating apparatus in a seventh embodiment of the present invention.

This embodiment differs from the previous embodiments in that a cleaning fluid spray nozzle 44 as a cleaning fluid supplying unit and a dry air nozzle 45 as a drying unit are provided close to a liquid absorbing roller 10 so as to be movable together with the roller 10. The other structure and the coating method are the same as those described in the previous embodiments.

After a substrate is dismounted, since a liquid film remains at least on the surface of the peripheral section of a stage 1, a cleaning fluid is applied to the stage from the moving cleaning fluid spray nozzle 44. The liquid absorbing roller 10 is pressed and moved on the surface of the peripheral section of the stage 1 while rotating the liquid absorbing roller 10 so as to remove a coating solution P adhering to the stage 1. Furthermore, by blowing dry air against the stage 1 from the moving dry air nozzle 45, the stage 1 is dried. Of course, as the coating solution removing unit, the one described in the second or third embodiment may be used, and as the coating unit, the coating roller used in the fifth embodiment may be used.

Examples of substrates used in the present invention include semiconductor wafers composed of silicon, silicon carbide, silicon-germanium alloys, gallium arsenide, indium arsenide, and the like; insulating substrates composed of quartz, sapphire, alumina, glass, resins, and the like; and metal substrates composed of aluminum, stainless steels, and the like. The above substrates may be provided with various types of elements, wiring, various thin films, etc.

Such substrates are used for fabricating semiconductor devices, LSIs, liquid crystal devices, optical disks, magnetic disks, magneto-optical disks, color filters, microlenses, etc.

Examples of the films formed in the present invention include water-repellent films, oil-repellent films, photosensitive films, insulating films, thermosetting films, photosetting films, biochemical films, and alignment films. For example, as the photosensitive films, photoresist films used for photolithography and for forming color filters may be formed. As the insulating films, insulating films between wires used for LSIs, liquid crystal devices, flat panel displays, etc. may be formed.

Specific examples are acrylic resins, phenolic resins, polyimides, fluorinated polyimides, polyvinyl alcohol, hydrogen silsequioxane (HSQ), benzocyclobutene (BCB), methyl silsequioxane (MSQ), polytetrafluoroethylene (PTFE), polyarylether, and fluorinated polyarylether.

Liquid films formed by the coating methods in accordance with the embodiments described above are subjected to baking at an appropriate temperature, for example, at 50° C. or more so that solvents and dispersion media are vaporized to solidify the films. With respect to photosetting films or photo-curable films, by further irradiation of light, such as ultraviolet light, solidified films are formed.

As the coating material (coating solution or coating fluid) used in the present invention, a starting material in which any one of the raw materials described above is dissolved or dispersed in a solvent or a dispersion medium may be used. Although the viscosity thereof depends on the starting material, it may be in the range of 10 cps to 100,000 cps.

The thickness of the liquid film is 0.3 $\mu$m to 200 $\mu$m, and since the thickness is decreased by baking after the liquid film is formed, it must be selected properly depending on the projected thickness of the film and the starting material to be used.

As the coating unit used in the present invention, a head or a roller used in the die coating method, the slit coating method, the extrusion coating method, and the roll coating method described above may be used.

The coating unit and the stage for holding a substrate are moved relative to each other during coating, and only the head or the roll may be moved in one direction, only the stage may be moved in one direction, or both may be moved respectively.

The height of the peripheral section of the stage is substantially level with the surface of the substrate to be coated as described above. If the peripheral section is higher than the substrate, the liquid film easily encloses bubbles, and if the peripheral section is lower than the substrate, the liquid film is easily separated. Although it depends on the viscosity of the coating solution and the thickness of the liquid film, if the height of the surface of the substrate ranges from 20 $\mu$m lower to 200 $\mu$m higher in comparison with the height of the peripheral section, occurrence of such inconveniences can be sufficiently suppressed.

Although the surface of the peripheral section is aligned to the surface of the substrate to be mounted by forming a recess in the stage in the individual embodiments, it may be possible to construct the stage by placing a member, such as a guide ring, having an opening which is shaped complementary to the substrate and having the same thickness as that of the substrate, on a planar table.

The distance between the point where coating starts on the peripheral section of the stage and the edge of the substrate is preferably set at 1 mm or more, and more preferably, 5 mm to 30 mm. On the other hand, the distance between the opposite edge of the substrate and the point where the coating ends is preferably set at 1 mm or more. In either case, as the distance increases, the consumption of the coating solution increases, and therefore, the upper limit of the distance may be determined in consideration of the amount of coating used. The length of the slit is preferably at least 1 mm longer than the width of the substrate.

As the coating material removing unit used in the present invention, a liquid absorbing sheet may be used instead of the liquid absorbing roller, the liquid absorbing block, and the suction slit described above. When the coating material is removed, only the coating material removing unit, such as the roller, the block, or the slit, may be moved, only the stage may be moved, or both may be moved.

Additionally, a cleaning fluid supplying unit which supplies a cleaning fluid comprising an organic solvent, such as a ketone, e.g., acetone and isopropyl alcohol, or alcohol, or water, in which the coating solution is dissolved, may be provided so as to wet clean the peripheral section of the stage and the substrate-holding section. Furthermore, an absorber, such as a sponge, which removes the organic solvent as well as the coating material, may be provided and used for removing them after wet cleaning is performed. Additionally, as required, a drying unit for drying the peripheral section of the stage and the substrate-holding section by blowing dry air or dry nitrogen against the stage may be also provided.

As described above, in accordance with the present invention, it is possible to form a liquid film on a nonrectangular substrate, such as a wafer, by the die coating method, or the like, without causing nonuniform thickness, e.g., the formation of stripes. The coating apparatus for applying a liquid film to the substrate includes a coating solution removing unit for removing the coating solution adhering to a stage for holding the substrate so that the coating solution on the stage is removed by the coating solution removing unit every time the coating solution is applied to the substrate.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A coating method for forming a film of a coating material on a substrate held by a stage by supplying the coating material from a coating unit onto the substrate while the coating unit is moved relative to the stage, the stage comprising a substrate-holding section in the form of a recess of a size corresponding to the size of the substrate, and a peripheral section surrounding said substrate-holding section and having a surface higher than that of the substrate-holding section, the coating method comprising the steps of:
    mounting the substrate on the substrate-holding section of the stage;
    forming the film of the coating material so that the coating covers the substrate and extends to said peripheral section over the entire circumference of the substrate;
    demounting the coated substrate from the stage; and
    removing the coating material remaining in the peripheral section by contacting the stage with and moving a coating material removing unit,
    wherein said coating material removing unit comprises either one of a liquid absorbing roller or a liquid absorbing block for absorbing the coating material adhering to the surface of the peripheral section, said liquid absorbing roller and said liquid absorbing block comprising a porous structure and an absorbent fabric for accelerating the absorption of said coating material provided on the surface of said porous structure, and the coating material adhering to the peripheral section is removed by moving either one of the liquid absorbing roller or the liquid absorbing block relative to the stage while bringing one of the liquid absorbing roller and the liquid absorbing block into contact with the peripheral section of the stage and wherein the coating material is removed by suction through either one of the liquid absorbing roller or the liquid absorbing block using a vacuum suction means connected to the porous structure.

2. A coating method according to claim 1, wherein the substrate has a nonrectangular shape.

3. A coating method according to claim 1, wherein coating starts and coating ends on the peripheral section of the stage.

4. A coating method according to claim 1, wherein the coating material is removed while a cleaning fluid is supplied to the peripheral section.

5. A coating method according to claim 1, wherein the peripheral section is dried after the coating material is removed.

6. A coating method according to claim 1, wherein the coating unit comprises a slit and the film is formed by ejecting the coating material from the slit.

7. A coating method according to claim 1, wherein the coating unit comprises a slit which is longer than the maximum width of the substrate, and the film is formed by ejecting the coating material from the slit while the coating unit is moved in a direction perpendicular to the longitudinal direction of the slit.

8. A method of forming a film on a substrate comprising the steps of:
    forming a film of a coating material on the substrate by the coating method according to claim 1; and
    baking the film of the coating material.

9. A method of forming a film according to claim 8, wherein the film is selected from the group consisting of a water-repellent film, an oil-repellent film, a photosensitive film, an insulating film, a thermosetting film, a photo-setting film, and an alignment film.

10. A coating method according to claim 1, wherein the substrate is held on the stage by negative pressure.

11. A coating apparatus comprising:
    a stage for holding a substrate, the stage comprising an upper surface having
        i) a substrate-holding section in the form of a recess of a size corresponding to the size of the substrate for holding the substrate; and
        ii) a peripheral section surrounding said substrate-holding section to be applied with a coating material having a surface which is higher than that of the substrate-holding section;
    a coating unit for supplying the coating material to the substrate and said peripheral section, a film of the coating material being formed by supplying the coating material to the substrate held by the stage while the coating unit and the stage are moved relative to each other; and
    a coating material removing unit which removes the coating material applied to the peripheral section of the stage by contact with the stage and by movement relative thereto,
    wherein said coating material removing unit comprises either one of a liquid absorbing roller or a liquid absorbing block for absorbing the coating material adhering to the surface of the peripheral section, said liquid absorbing roller and said liquid absorbing block comprising a porous structure and an absorbent fabric for accelerating the absorption of said coating material provided on the surface of said porous structure, and a moving means for moving one of the liquid absorbing roller and the liquid absorbing block relative to the stage while bringing one of the liquid absorbing roller and the liquid absorbing block into contact with the peripheral section of the stage and wherein the coating material is removed by suction through either one of the liquid absorbing roller or the liquid absorbing block using a vacuum suction means connected to the porous structure.

12. A coating apparatus according to claim 11, wherein the substrate-holding section comprises a nonrectangular recess.

13. A coating apparatus according to claim 11, wherein the movement of the coating unit and the stage are controllable so that coating starts and coating ends on the peripheral section of the stage.

14. A coating apparatus according to claim 11, further comprising a cleaning fluid supply for supplying a cleaning solution to the peripheral section in order to remove the coating material.

15. A coating apparatus according to claim 11, further comprising a dryer for drying the peripheral section after the coating material is removed.

16. A coating apparatus according to claim 11, wherein the stage has a suction hole for holding the substrate by negative pressure.

* * * * *